(12) United States Patent
Paek et al.

(10) Patent No.: US 8,786,067 B2
(45) Date of Patent: Jul. 22, 2014

(54) SEMICONDUCTOR PACKAGE HAVING IMPROVED HEAT SPREADING PERFORMANCE

(75) Inventors: Soo-Jin Paek, Gyeonggi-do (KR); Woo-Seop Kim, Seoul (KR); Ki-Sung Kim, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 174 days.

(21) Appl. No.: 13/089,120

(22) Filed: Apr. 18, 2011

(65) Prior Publication Data

US 2011/0193214 A1    Aug. 11, 2011

Related U.S. Application Data

(63) Continuation of application No. 11/934,635, filed on Nov. 2, 2007, now Pat. No. 7,973,400.

(30) Foreign Application Priority Data

Nov. 16, 2006  (KR) .......................... 10-2006-0113408

(51) Int. Cl.
*H01L 23/02* (2006.01)
*H01L 23/48* (2006.01)

(52) U.S. Cl.
USPC ..... 257/686; 257/784; 257/780; 257/E23.101

(58) Field of Classification Search
USPC ................... 257/686, 706–707, 717, E23.08, 257/E23.101
See application file for complete search history.

(56) References Cited

U.S. PATENT DOCUMENTS

| | | | |
|---|---|---|---|
| 6,271,056 B1 * | 8/2001 | Farnworth et al. | 438/106 |
| 6,388,333 B1 * | 5/2002 | Taniguchi et al. | 257/777 |
| 6,455,928 B2 * | 9/2002 | Corisis et al. | 257/686 |
| 6,479,321 B2 * | 11/2002 | Wang et al. | 438/109 |
| 6,977,440 B2 * | 12/2005 | Pflughaupt et al. | 257/777 |
| 7,408,255 B2 * | 8/2008 | Corisis et al. | 257/686 |
| 7,550,835 B2 * | 6/2009 | Kang | 257/686 |
| 2003/0174478 A1 * | 9/2003 | Oggioni et al. | 361/760 |
| 2003/0197260 A1 | 10/2003 | Nishimura et al. | |
| 2005/0199992 A1 * | 9/2005 | Baek et al. | 257/686 |
| 2005/0199993 A1 | 9/2005 | Lee et al. | |
| 2006/0006517 A1 | 1/2006 | Lee et al. | |

FOREIGN PATENT DOCUMENTS

| | | |
|---|---|---|
| JP | 08-017975 | 1/1996 |
| JP | 2001-085603 | 3/2001 |
| JP | 2002-176135 | 6/2002 |
| KR | 2005-0090882 | 9/2005 |
| KR | 2006-0080420 | 7/2006 |

* cited by examiner

*Primary Examiner* — Nitin Parekh
(74) *Attorney, Agent, or Firm* — Muir Patent Consulting, PLLC

(57) ABSTRACT

A semiconductor package having a structure in which heat produced in the interior of the package is effectively spread to the outside of the package is provided. The semiconductor package includes one or more semiconductor chips, one or more substrates (PCBs) having the semiconductor chips respectively attached thereto, a plurality of conductive balls such as a plurality of solder balls to provide voltages and signals to the one or more semiconductor chips, and a heat sink positioned to spread heat produced in the interior of the package to the outside and directly connected to at least one of the plurality of solder balls.

18 Claims, 4 Drawing Sheets

SEMICONDUCTOR PACKAGE HAVING IMPROVED HEAT SPREADING PERFORMANCE

CROSS-REFERENCE TO RELATED PATENT APPLICATION

This application is a continuation application and claims priority from U.S. patent application Ser. No. 11/934,635, filed on Nov. 2, 2007 now U.S. Pat. No. 7,973,400, which claims the benefit of Korean Patent Application No. 10-2006-0113408, filed on Nov. 16, 2006, in the Korean Intellectual Property Office, the disclosure of each of which is incorporated herein by reference.

BACKGROUND

1. Field of the Invention

The present invention relates to a semiconductor package, and more particularly, to a semiconductor package capable of effectively radiating heat produced in the interior thereof.

2. Description of the Related Art

As semiconductor packages having semiconductor chips mounted therein are highly integrated and operated at high speeds, their operation speeds have been greatly increased and their sizes have been reduced. This leads to higher temperatures in the packages, especially for multi chip packages (MCPs), which contain two or more chips in one package. High temperatures in the interior of a package can cause stress on the chips mounted in the package and often result in malfunctions. The operation speed of the chips is also reduced by high temperatures. Particularly, the refresh characteristics of DRAM semiconductor chip are degraded with high temperatures in the packages.

FIG. 1 shows the heat spreading path in a typical semiconductor package. The semiconductor package is illustrated as an example of a 1-chip 1-package having one semiconductor chip.

As shown in this figure, the typical semiconductor package 10 includes a semiconductor chip 11, a printed circuit board (PCB) 12, at least one solder ball 14 electrically connecting the semiconductor chip 11 to the PCB 12, and at least one solder ball 15 electrically connecting the semiconductor package 10 to the outside. The semiconductor package 10 is connected to a circuit board through the solder ball 15 to receive power and signals, which are required in the semiconductor chip 11, from the outside.

The arrows in this figure indicate heat spreading paths. The solid arrows indicate the paths along which heat spreads through air, and the dotted arrows indicate the paths along which heat is conducted through materials inside the semiconductor package to the outside.

As shown in this figure, heat is spread to the outside through both the air and the material inside the semiconductor package. Although heat produced in a semiconductor package is generally conducted through a board and effectively spread to the outside, only a small amount of heat is spread through the top of the package.

A conventional method of helping spread heat more efficiently is to attach a heat sink to the top surface of the semiconductor package in order to reduce the temperature inside the semiconductor package. FIG. 2 is a sectional view of a semiconductor package with a heat sink attached to the top surface of the semiconductor package.

As shown in FIG. 2, the semiconductor package 20 may include one or more semiconductor chips 22 and 23, substrates 24 and 25 each having a semiconductor chip stacked thereon, and one or more solder balls 27. A molding member 26 may be formed on the semiconductor package 20 to protect the semiconductor chips stacked inside the. A heat sink 21 may be further attached to the top of the package to radiate heat produced in the package.

However, multi-chip semiconductor packages such as dual stack packages (DSPs) or quad stack packages (QSPs) produce a great amount of heat, but there is a limit to the amount of heat that can be radiated. Further, there is a problem in that internal chips of a multi-chip package may reach different temperatures, which may affect the reliability of the internal chips and the package as a whole.

SUMMARY

Embodiments of the present invention provide a semiconductor package having a structure that can effectively spread heat produced in the interior of the package.

According to an embodiment of the present invention a semiconductor package includes one or more semiconductor chips arranged in a stack structure, one or more substrates (PCBs) having the semiconductor chips respectively attached thereto, a plurality of solder balls providing voltages and signals to the one or more semiconductor chips, and a heat sink positioned to spread heat produced in the interior of the package to the outside and connected directly to at least one of the plurality of solder balls.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully hereinafter with reference to the accompanying drawings, in which exemplary embodiments of the invention are shown. Like numbers refer to like elements throughout the specification.

Figure 1:
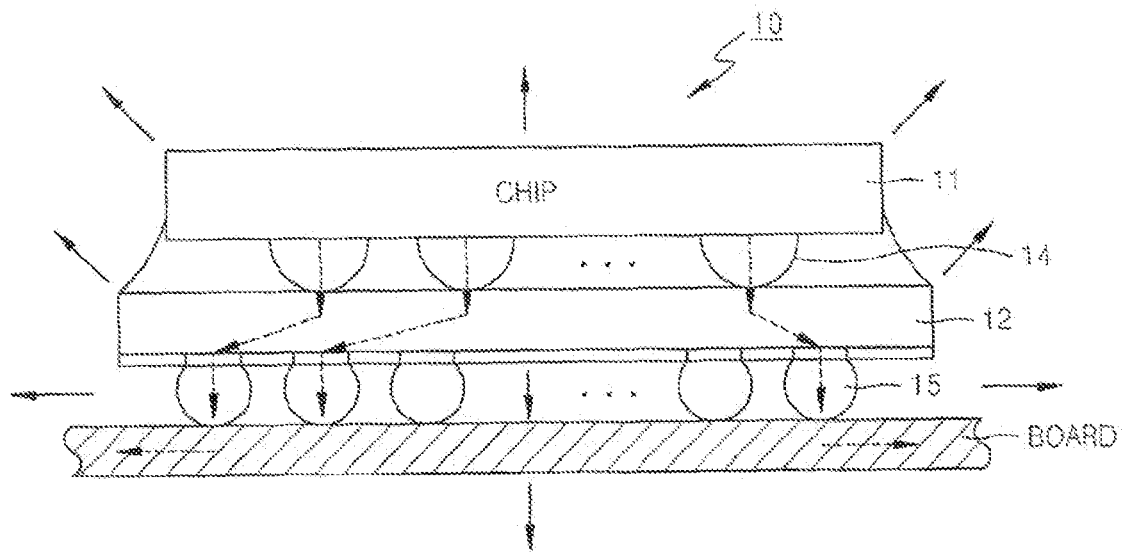
FIG. 1 shows the heat spreading path in a typical semiconductor package.
Figure 2:
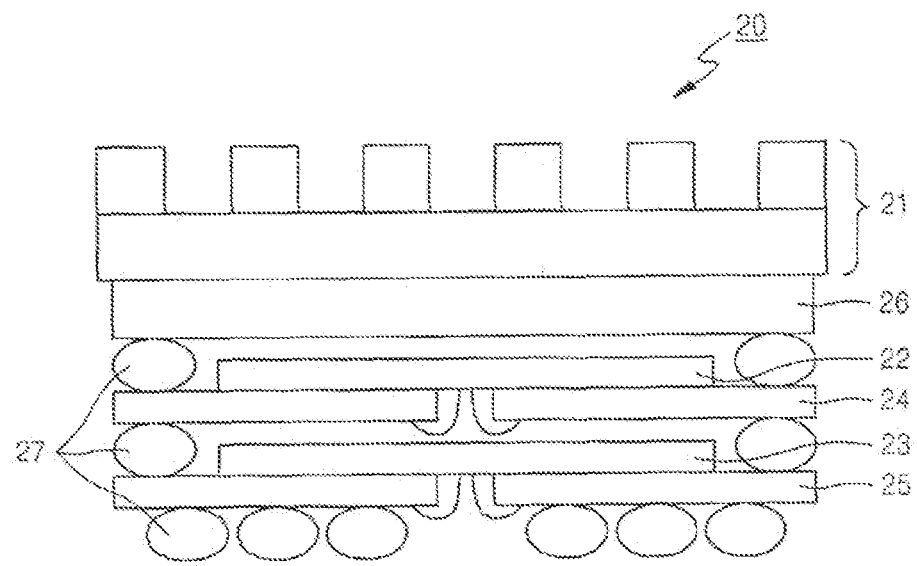
FIG. 2 is a sectional view of a conventional semiconductor package with a heat sink attached to a top thereof.
Figure 3:
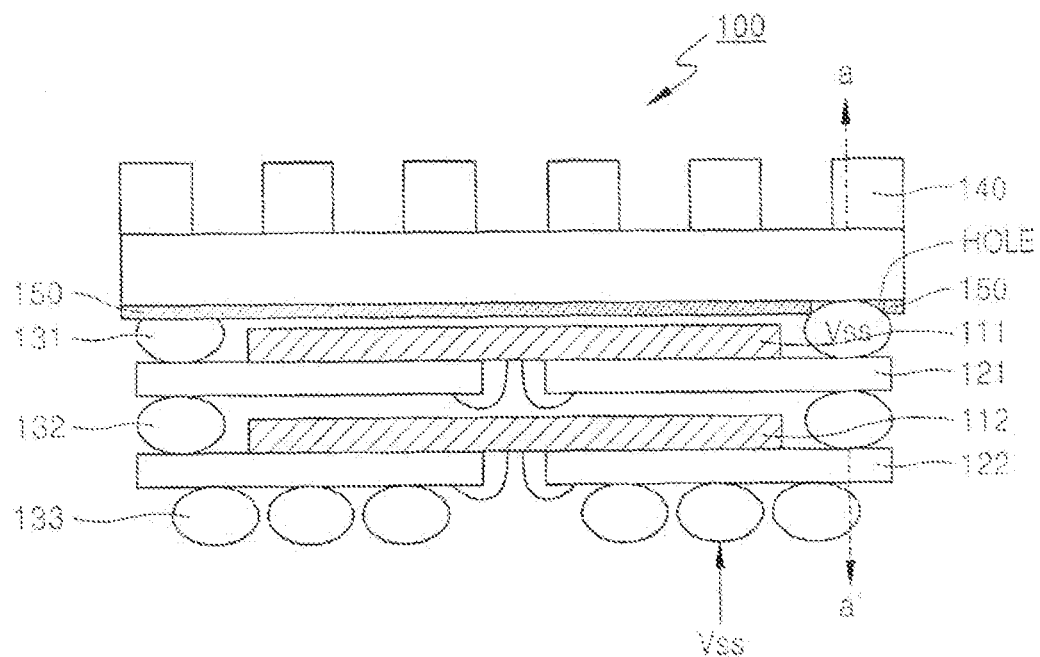
FIG. 3 is a sectional view showing a structure of a semiconductor package according to an embodiment of the present invention.

FIG. 3 is a sectional view of a semiconductor package according to an embodiment of the present invention. As shown in this figure, the semiconductor package 100 may include one or more semiconductor chips 111 and 112, one or more substrates (PCBs) 121 and 122, and a plurality of solder balls 131, 132, and 133.

In the semiconductor package 100 according to an embodiment of the present invention, one or more semiconductor chips may be arranged in a stack structure. As an example, semiconductor packages provided with a multi-chip structure, such as a dual stack package (DSP) and a quad stack package (QSP), may be applied. The semiconductor package shown in FIG. 3 includes two stacked semiconductor chips 111 and 112, as an example of a multi-chip package.

Each of the semiconductor chips may be attached to a substrate having a circuit pattern formed therein. As an example, the first semiconductor chip 111 is attached to the first substrate 121, and the second semiconductor chip 112 is attached to the second substrate 122.

Meanwhile, the plurality of solder balls 131, 132, and 133 are attached to the one or more substrates 121 and 122 to provide voltages and signals to the semiconductor chips 111 and 112. As an example, the solder balls 131 may be attached to the top surface of the first substrate 121, the solder balls 132 may be attached to the top surface of the second substrate 122, and the solder balls 133 may be attached to the bottom surface of the second substrate 122.

The semiconductor package 100 is connected to a main board (not shown) through the solder balls 133, and signals and power provided from the main board are transmitted to the respective semiconductor chips 111 and 112 through the substrates 121 and 122 having circuit patterns formed therein and the plurality of solder balls 131, 132, and 133.

Meanwhile, the semiconductor package 100 according to an embodiment of the present invention may further include a heat sink 140 for radiating heat produced in the package. The heat sink 140 is connected directly to at least one of the plurality of solder balls 131, 132, and 133. As an example, the heat sink 140 is connected directly to at least one of the plurality of solder balls 131 attached to the top surface of the first substrate 121.

A solder ball for transmitting a power voltage VDD or ground voltage VSS to the semiconductor chips 111 and 112 is connected to the heat sink 140. Since the transmission path of the power voltage VDD or ground voltage VSS is connected through the respective semiconductor chips 111 and 112 and the substrates 121 and 122, the heat sink 140 can be connected directly to the respective semiconductor chips 111 and 112 and the substrates 121 and 122. Accordingly, heat can be effectively spread. If the heat sink 140 is connected to a solder ball for providing a power voltage VDD, the power voltage VDD is exposed to the outside through the heat sink 140, which may cause problems. Thus, it may be preferable for the heat sink 140 to be connected to a solder ball providing a ground voltage VSS.

As the heat sink 140 is connected directly to at least one solder ball 131, particularly to a solder ball for providing a ground voltage VSS, the heat sink 140 forms a current path to the solder ball connected directly to the heat sink 140. That is, a current flows through the solder ball and the heat sink 140, so that all heat generated by this current can be spread directly to the outside through the heat sink 140.

Meanwhile, unlike the conventional package having a molding unit formed on the top thereof, the semiconductor package 100 according to an embodiment of the present invention may further include an insulating layer 150 positioned above the semiconductor chips 111 and 112 and the substrates 121 and 122 in order to protect a circuit in the package. More specifically, the insulating layer 150 may be attached between the solder balls 131 on the top surface of the first substrate 121 and the heat sink 140.

In order to allow the heat sink 140 to be connected directly to the solder balls 131 as described above, at least one hole is formed in the insulating layer 150. The hole is aligned with the solder ball for providing a ground voltage on the top of the first substrate 121. Although a solder ball for providing a ground voltage among the plurality of solder balls 131 is connected directly to the heat sink 140 as shown in this figure, the direct connection of the other solder balls to the heat sink 140 may be blocked by the insulating layer 150.

Figure 4A:
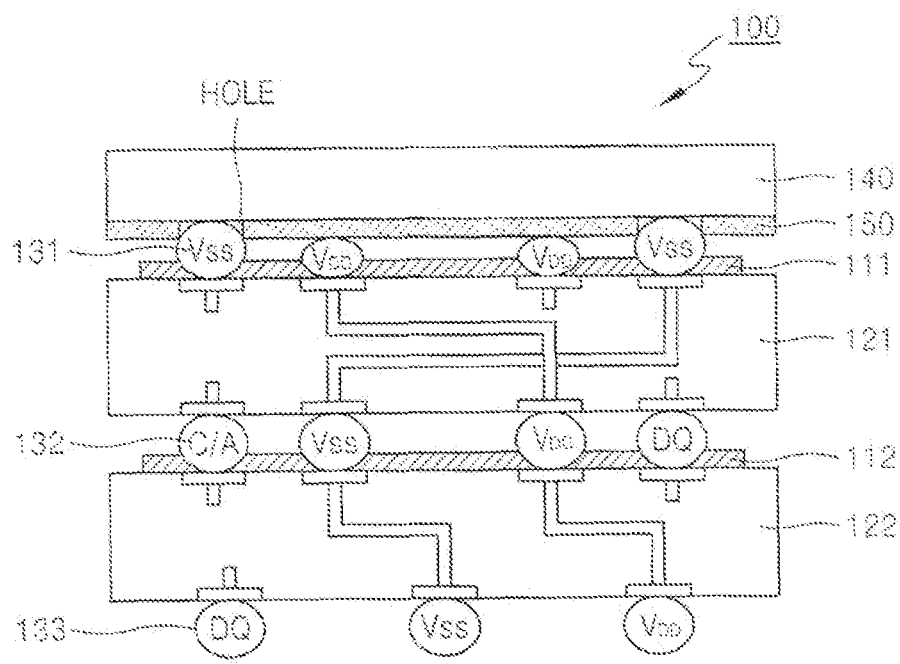
FIG. 4A is a sectional view of the semiconductor package taken along line a-a' of FIG. 3.
Figure 4B:
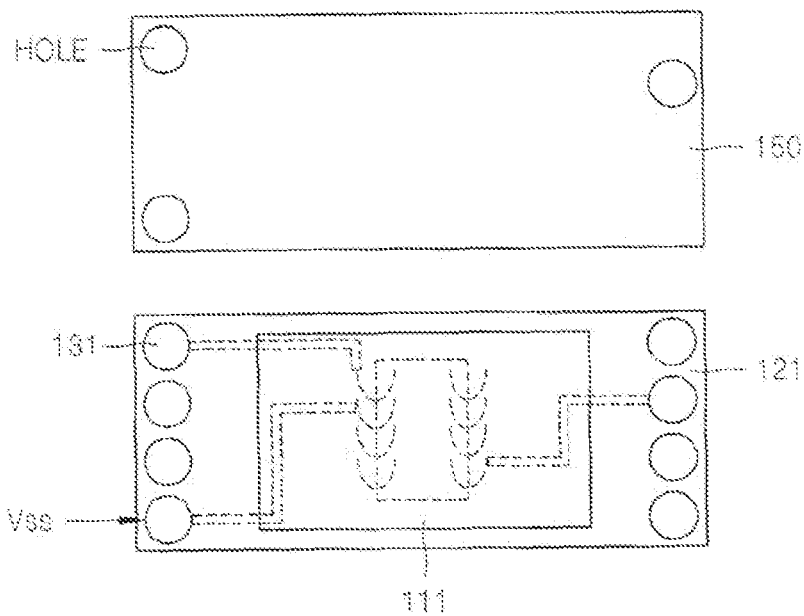
FIG. 4B is a plan view showing an insulating layer and a substrate illustrated in FIG. 3.

FIG. 4A is a section view of the semiconductor package taken along line a-a' of FIG. 3, and FIG. 4B is a plan view showing an insulating layer and a substrate illustrated in FIG. 3.

The sectional view with a shape shown in FIG. 4A may be conceived by vertically cutting the semiconductor package in the direction a-a' and then rotating it by 90 degrees. As shown in FIG. 4A, the first and second semiconductor chips 111 and 112 are attached respectively to the first and second substrates 121 and 122. The solder balls 131 may be attached to the top surface of the first substrate 121, the solder balls 132 may be attached to the top surface of the second substrate 122, and the solder balls 133 may be attached to the bottom surface of the second substrate 122.

The solder balls for providing a ground voltage VSS may be electrically connected to one another through circuit patterns formed in the substrates 121 and 122. Similarly, the solder balls for providing a power voltage VDD may be electrically connected to one another through circuit patterns formed in the substrates 121 and 122. The heat sink 140 is positioned on the top of the semiconductor package, and connected directly to the solder balls for providing a ground voltage VSS, which are attached to the top surface of the first substrate 121.

Meanwhile, the insulating layer 150 is positioned between the heat sink 140 and the solder balls 131 attached to the top surface of the first substrate 121. One or more holes are formed in the insulating layer 150, and are respectively aligned with one or more of the solder balls 131 providing a ground voltage VSS. The heat sink 140 is connected directly to the solder ball providing a ground voltage VSS through the hole. Accordingly, a current path is formed through the semiconductor chips 111 and 112, the substrates 121 and 122, and the heat sink 140.

FIG. 4B is a plan view showing the insulating layer 150 and the first substrate 121. As shown in this figure, one or more holes are formed in the insulating layer 150. The first semiconductor chip 111 is attached to one surface of the first substrate 121, and one or more solder balls 131 are attached to the top surface of the first substrate 121. One or more of the plurality of solder balls 131 may provide a ground voltage VSS, and the one or more holes may be respectively aligned with the one or more solder balls providing the ground voltage VSS.

Figure 5:
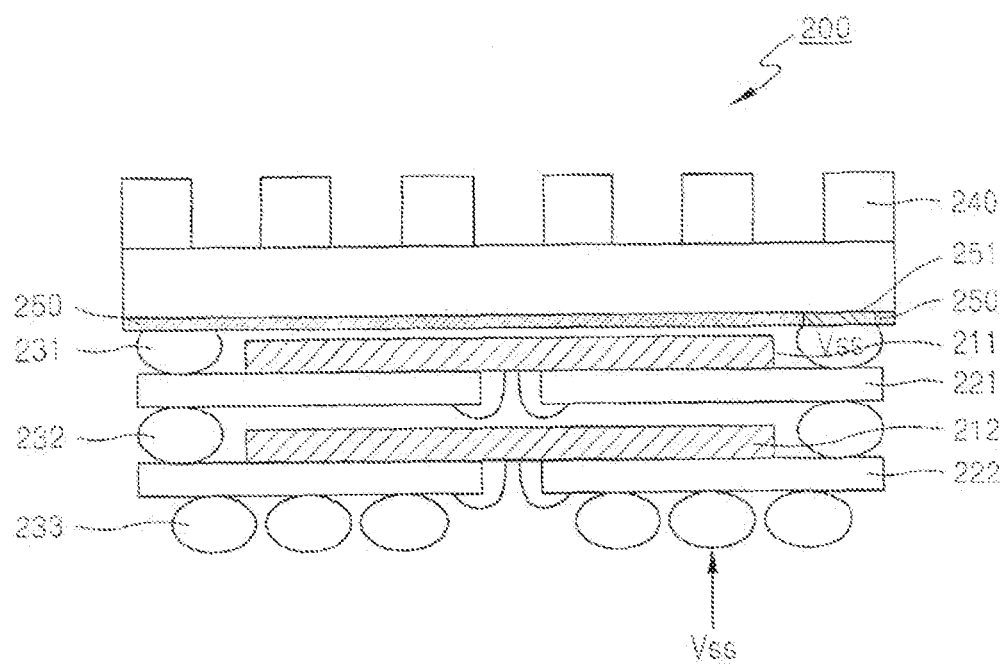
FIG. 5 is a sectional view of a semiconductor package according to an embodiment of the present invention.

FIG. 5 is a sectional view of a semiconductor package according to an embodiment of the present invention. The semiconductor package 200 may include one or more semiconductor chips 211 and 212 arranged in a stack structure, and respectively mounted on one or more substrates 221 and 222. Further, the semiconductor package 200 may further include one or more solder balls 231, 232, and 233 for providing voltages and signals from the outside to the semiconductor chips 211 and 212, a heat sink 240 for radiating heat produced in the package to the outside, and an insulating layer 250 positioned between the heat sink 240 and the solder balls 231 attached to the top surface of the first substrate 221.

In this embodiment, unlike an insulating layer having at least one hole, the insulating layer 250 has a conductive layer 251 aligned with at least one of the plurality of the solder balls 231. Preferably, the conductive layer 251 is aligned with a solder ball providing a voltage (VDD or VSS) attached to the top surface of the first substrate 221. As described above, it is preferred that the conductive layer 251 is aligned with one or more solder balls providing a ground voltage VSS.

According to the configuration described above, the heat sink 240 is electrically connected to the one or more solder balls providing a ground voltage VSS. The heat sink 240 is electrically connected to the semiconductor chips and the substrates through the conductive layer 251. Heat produced by a current is spread through the heat sink 240. Accordingly, heat produced in the package can be much more effectively spread to the outside compared with a structure in which a heat sink is connected to the top of a molding material.

Figure 6:
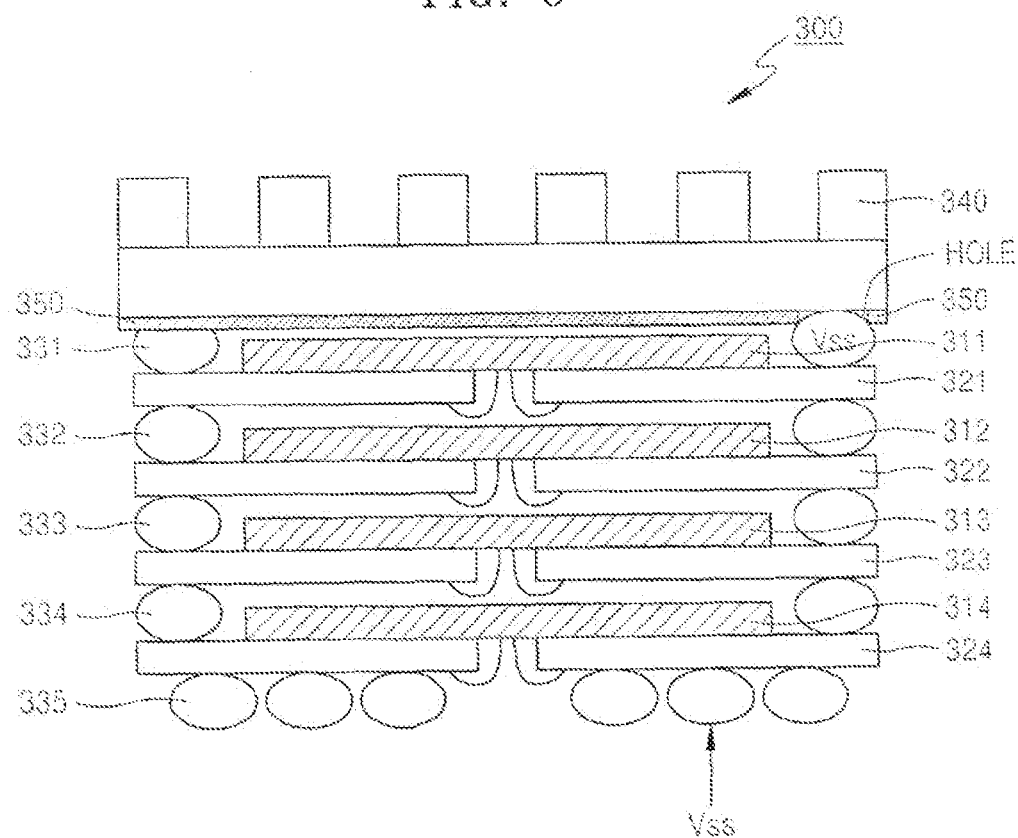
FIG. 6 is a sectional view showing a semiconductor package provided with a quad stack package (QSP) structure according to an embodiment of the present invention.

FIG. 6 is a sectional view of a semiconductor package having a quad stack package (QSP) structure according to an embodiment of the present invention. As shown in this figure, the semiconductor package 300 provided with a QSP structure includes four semiconductor chips 311 to 314, respectively mounted on four substrates 321 to 324.

A plurality of solder balls 331 to 335 for transmitting signals and voltages are attached respectively to top surfaces of the respective substrates 321 to 324 (except for solder balls 335, which are formed on the lower surface of substrate 324), and a heat sink 340 for radiating heat produced in the package is positioned above the first substrate 321. An insulating layer 350 is positioned between the solder balls 331 attached to the top surface of the first substrate 321 and the heat sink 340. One or more holes may be formed in the insulating layer 350 to allow the heat sink 340 to be connected directly to the solder balls 331. Preferably, the hole may be aligned with at least one solder ball transmitting a ground voltage, among the plurality of solder balls 331.

Meanwhile, although not shown in this figure, the insulating layer 350 may include a conductive layer formed in at least one position so as to allow the solder ball 331 and the heat sink 340 to be electrically connected to each other through a conductive material. In the case of the configuration described above, the insulating layer 350 may be coated on the top of the package during the manufacturing the semiconductor package and the heat sink may be attached in a later process. An additional heat sink may be attached to the top surface of the insulating layer 350, as well.

Figure 7:
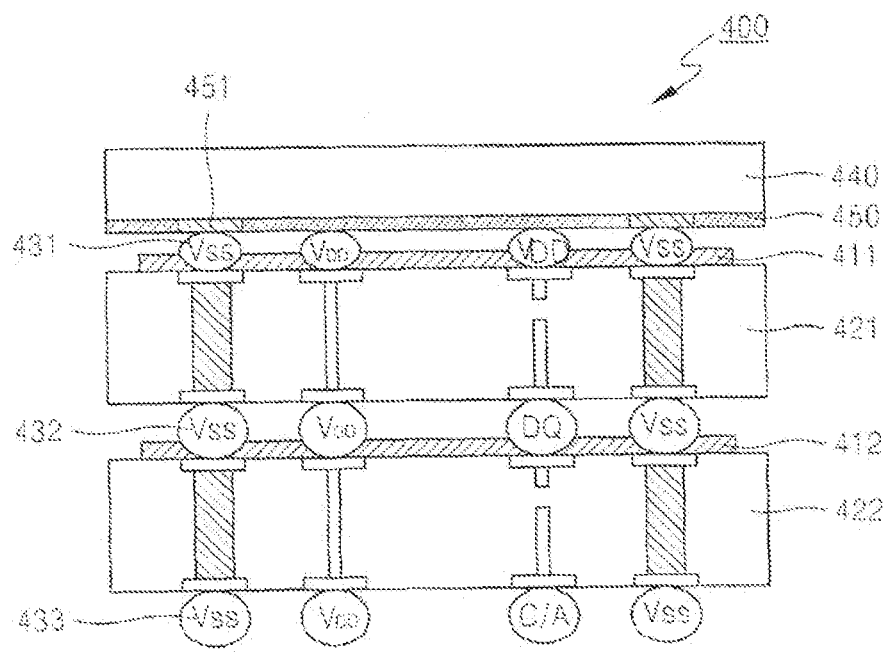
FIG. 7 is a sectional view of a semiconductor package according to an embodiment of the present invention.

FIG. 7 is a sectional view of a semiconductor package according to an embodiment of the present invention. As an example, the semiconductor package 400 includes two semiconductor chips 411 and 412, respectively mounted on two substrates 421 and 422. The two substrates 421 and 422 may have substantially the same structure. However, in other embodiments, additional semiconductor chips and substrates may be included in the package.

At least one via is formed in each of the substrates 421 and 422. Particularly, the via is aligned with a solder ball providing a ground voltage, among a plurality of Solder balls 431, 432 and 433 providing signals and voltages to the semiconductor chips 411 and 412.

Meanwhile, a heat sink 440 is attached to the top of the package, and an insulating layer 450 is attached between the heat sink 440 and the solder balls 431 on the top surface of the substrate 421 stacked in an upper portion of the package. The insulating layer 450 may have conductive layers 451 aligned with the one or more solder balls providing a ground voltage VSS and the one or more vias. Further, holes may be formed instead of the conductive layers 451 as described above, so that the heat sink 440 can be connected directly to the solder balls. According to the configuration described above, heat produced in the semiconductor package can be effectively spread to the outside, and the temperature difference between semiconductor chips can be reduced.

As described above, since a semiconductor package according to the present invention has a structure in which a heat sink, a semiconductor chip, and a substrate are electrically connected to one another, there is an advantage in that heat produced in the semiconductor package can be effectively spread.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package, comprising:
   a plurality of semiconductor chips arranged in a stack structure, the plurality of semiconductor chips including an upper-most semiconductor chip of the semiconductor package;
   a plurality of substrates having the semiconductor chips respectively attached thereto, each substrate having one or more vias, the plurality of substrates including an upper-most substrate of the semiconductor package;
   a plurality of solder balls arranged to provide voltages and signals to the plurality of semiconductor chips;
   a heat sink positioned to spread heat produced in the interior of the package to the outside, the heat sink connected to at least a first solder ball of the plurality of solder balls and positioned above the upper-most semiconductor chip of the semiconductor package, wherein the heat sink is the only heat sink in the semiconductor package; and
   an insulating layer positioned between the upper-most substrate and the heat sink,
   wherein a first via in the upper-most substrate is vertically aligned with the first solder ball, at least a second via in a second, lower substrate, and at least a second solder ball disposed between and connecting the first via and second via, and is connected with the first solder ball and the second solder ball, and wherein the insulating layer includes a first hole or a first conductive layer which is vertically aligned with the first solder ball, the first via, second solder ball, and second via, whereby vertical alignment corresponds to a location of the first solder ball with respect to the first via, and the first solder ball, the first via, the second solder ball, and the second via are electrically connected to the heat sink through the first hole or the first conductive layer such that the first solder ball is disposed to pass heat from a second chip corresponding to the second substrate to the heat sink.

2. The semiconductor package of claim 1, wherein the first solder ball provides a ground voltage to the semiconductor chip.

3. The semiconductor package of claim 1, wherein a plurality of solder balls are attached to each of the one or more substrates.

4. The semiconductor package of claim 3, wherein the insulating layer has at least the first hole through which the first solder ball directly connects to the heat sink.

5. The semiconductor package of claim 4, wherein the first hole is aligned with the first solder ball providing a ground voltage to the semiconductor chip and the first via corresponding to the first solder ball.

6. The semiconductor package of claim 1, wherein each of the one or more vias is disposed through a corresponding substrate.

7. The semiconductor package of claim 1, wherein:
the insulating layer is directly attached to the heat sink, and includes the first hole, through which the first solder ball directly connects to the heat sink.

8. The semiconductor package of claim 1, wherein the heat sink is directly connected to at least a third solder ball of the plurality of solder balls, and wherein a third via of the one or more vias is vertically aligned with the third solder ball and is connected with the third solder ball.

9. A semiconductor package, comprising:
a plurality of semiconductor chips arranged in a stack structure;
a plurality of substrates having the semiconductor chips respectively attached thereto, each substrate having one or more vias, the plurality of substrates including an upper-most substrate of the semiconductor package;
a plurality of solder balls arranged to provide voltages and signals to the plurality of semiconductor chips;
a heat sink positioned to spread heat produced in the interior of the package to the outside, the heat sink connected to at least a first solder ball of the plurality of solder balls and positioned above the upper-most semiconductor chip of the semiconductor package; and
an insulating layer positioned between the upper-most substrate and the heat sink,
wherein a first via in the upper-most substrate extends along a line in a vertical direction from a bottom of the upper-most substrate toward a top of the upper-most substrate, and the first solder ball is disposed along the line, at least a second via is disposed in a second, lower substrate, and a second solder ball is disposed between and connects the first via and the second via, both the second via and second solder ball also extending along the line, and wherein the insulating layer includes a first hole or a first conductive layer which is vertically aligned with the first solder ball, the first via, the second solder ball, and the second via, and the first solder ball, and the first via, the second solder ball, and the second via are electrically connected to the heat sink through the first hole or the first conductive layer; and
wherein the heat sing comprises a single heat sink, wherein the heat sink is the only heat sink positioned to dissipate heat generated by the first semiconductor chip through at least the first via and first solder ball, and to dissipate heat generated by the second semiconductor chip through at least the second via, second solder ball, first via, and the first solder ball.

10. The semiconductor package of claim 9, wherein the first solder ball provides a ground voltage to the semiconductor chip.

11. The semiconductor package of claim 9, wherein each of the one or more vias is disposed through a corresponding substrate.

12. The semiconductor package of claim 9, wherein:
the insulating layer is directly attached to the heat sink, wherein the insulating layer includes the first hole through which the first solder ball directly connects to the heat sink.

13. The semiconductor package of claim 9, wherein the heat sink is directly connected to at least a third solder ball of the plurality of solder balls, and wherein a third via of the one or more vias extends along a second line in a vertical direction from a bottom of the upper-most substrate toward a top of the upper-most substrate, and the second solder ball is disposed along the line.

14. The semiconductor package of claim 9, wherein a plurality of solder balls are attached to each of the one or more substrates.

15. The semiconductor package of claim 14, wherein the insulating layer has at least the first hole through which the first solder ball directly connects to the heat sink.

16. The semiconductor package of claim 15, wherein the first hole is aligned with the first solder ball providing a ground voltage to the semiconductor chip and the first via corresponding to the first solder ball.

17. The semiconductor package of claim 1, wherein the first via and the first solder ball each are each disposed between outer edges of at least a first semiconductor chip of the one or more semiconductor chips, when viewed from a cross-sectional view.

18. A semiconductor package, comprising:
a plurality of semiconductor chips arranged in a stack structure;
a plurality of substrates having the semiconductor chips respectively attached thereto, each substrate having one or more vias, wherein the plurality of semiconductor chins include a top-most semiconductor chip of the package and a bottom-most semiconductor chip of the package;
a plurality of solder balls arranged to provide voltages and signals to the plurality of semiconductor chips; and
a heat sink positioned to spread heat produced in the interior of the package to the outside, the heat sink connected to at least a first solder ball of the plurality of solder balls,
wherein a first via of the one or more vias is vertically aligned with the first solder ball and is connected with the first solder ball to be electrically connected to the heat sink through the first solder ball, whereby vertical alignment corresponds to a location of the first solder ball with respect to the first via,
wherein the first solder ball and first via are positioned to pass heat generated by each of the plurality of semiconductor chips to the heat sink,
wherein no heat sinks are disposed between the top-most semiconductor chip and the bottom-most semiconductor chip, the semiconductor package further comprising an insulating layer positioned between an upper-positioned substrate and the heat sink, wherein the insulating layer includes a first hole or a first conductive layer which is vertically aligned with the first solder ball and the first via, and the first solder ball and the first via are electrically connected to the heat sink through the first hole or the first conductive layer.

* * * * *